(12) United States Patent
Orihashi (10) Patent No.: US 11,343,912 B2
(45) Date of Patent: May 24, 2022

(54) ELECTRONIC CIRCUIT APPARATUS

(71) Applicant: NEC CORPORATION, Tokyo (JP)

(72) Inventor: Naoyuki Orihashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/102,727

(22) Filed: Nov. 24, 2020

(65) Prior Publication Data
US 2021/0161005 A1 May 27, 2021

(30) Foreign Application Priority Data

Nov. 26, 2019 (JP) .............................. JP2019-213323

(51) Int. Cl.
*H05K 1/02* (2006.01)
*H05K 1/11* (2006.01)

(52) U.S. Cl.
CPC ......... *H05K 1/0296* (2013.01); *H05K 1/0237* (2013.01); *H05K 1/11* (2013.01)

(58) Field of Classification Search
CPC .. H05K 1/0216; H05K 1/0296; H05K 1/0215; H05K 1/0237; H05K 1/11; H05K 2201/093
See application file for complete search history.

(56) References Cited

U.S. PATENT DOCUMENTS

| | | | | | |
|---|---|---|---|---|---|
| 5,426,399 | A | * | 6/1995 | Matsubayashi | ...... H01B 7/0861 174/117 FF |
| 5,642,557 | A | * | 7/1997 | Clews | ................... E04B 2/7442 24/339 |
| 2012/0073124 | A1 | * | 3/2012 | Chien | ..................... G06F 3/041 29/622 |
| 2014/0252612 | A1 | * | 9/2014 | Nakagawa | ........ H01L 23/49822 257/738 |
| 2017/0115775 | A1 | * | 4/2017 | Wu | ................... H01L 29/78633 |

FOREIGN PATENT DOCUMENTS

JP     2010-210297 A     9/2010

* cited by examiner

*Primary Examiner* — Hoa C Nguyen (57) ABSTRACT

An electronic circuit apparatus according an aspect of the present disclosure includes a substrate, an electronic circuit disposed on the substrate, and metal patterns and formed on the same surface as a surface on which the electronic circuit is disposed, the metal patterns and being provided so as to be in an electrically floating state, in which the metal patterns and are disposed at places where they have a specified distance from the electronic circuit.

7 Claims, 10 Drawing Sheets

SCHEMATIC SIDE VIEW

Fig. 6

SCHEMATIC SIDE VIEW

SCHEMATIC SIDE VIEW

Fig. 9

SCHEMATIC SIDE VIEW

: DIRECTION IN WHICH STRENGTH OF RADIO WAVES IS INCREASED

——·—— : EMITTED WAVES

------------ : SCATTERED WAVES

Fig. 10

ELECTRONIC CIRCUIT APPARATUS

INCORPORATION BY REFERENCE

This application is based upon and claims the benefit of priority from Japanese patent application No. 2019-213323, filed on Nov. 26, 2019, the disclosure of which is incorporated herein in its entirety by reference.

TECHNICAL FIELD

The present disclosure relates to an electronic circuit apparatus, and in particular to an electronic circuit apparatus in which a plurality of electronic circuits are mounted on a system board.

BACKGROUND ART

In an electronic circuit apparatus in which electronic circuits are mounted on a substrate (e.g., a system board), electromagnetic waves are leaked or emitted (hereinafter referred to simply as emission) as these electronic circuits operate individually. The electromagnetic waves emitted in such a manner affect not only peripheral electronic circuits or electronic components, but also affect the electrical characteristics of the electronic circuits themselves. In particular, when the emitted electromagnetic waves are in a high frequency range called millimeter waves/submillimeter waves, their effect is large. This is because since the wavelength in the frequency band of the emitted electromagnetic waves in such a high frequency range is about 0.3 mm to 3 mm, it is almost equal to the size (i.e., the length) of the peripheral circuit components, so that the electromagnetic waves easily enter these circuit components. Further, since the sizes of the circuit components are roughly equal to that of the aforementioned wavelength in the frequency band, resonance and/or oscillations tend to occur due to the relation between the arrangement of the components and the wavelength of the emitted electromagnetic waves. Therefore, in such electronic circuit apparatuses, it is a significant challenge to suppress electromagnetic waves emitted from electronic circuits as described above.

Japanese Unexamined Patent Application Publication No. 2010-210297 discloses an example of a technique for suppressing or avoiding electromagnetic waves emitted from a circuit component. Japanese Unexamined Patent Application Publication No. 2010-210297 discloses, in claim 1, a wide coverage radar apparatus that detects an object in a predetermined angular range by transmitting and receiving a high-frequency signal, including: a transmitting antenna and a receiving antenna arranged on a substrate; a radome including an upper cover part having a predetermined thickness, the upper cover part being positioned at a place where it faces an emission surface of the transmitting antenna, and the radome being configured to cover the transmitting antenna and the receiving antenna; and an absorbing element disposed between the transmitting antenna and the receiving antenna and being in contact with an inner surface of the upper cover part and the substrate, the absorbing element being configured to absorb a direct wave of the high-frequency signal that has been emitted from the transmitting antenna, been reflected by the upper cover part, and propagated to the receiving antenna side.

However, the method disclosed in Japanese Unexamined Patent Application Publication No. 2010-210297 is a method in which new components are added. Therefore, there is a problem that the number of components in the product increases and hence the apparatus becomes complicated.

SUMMARY

An example object of the present disclosure is to reduce the number of components and simplify a configuration.

In a first example aspect, an electronic circuit apparatus includes: a substrate; an electronic circuit disposed on the substrate; and a metal pattern formed on the same surface as a surface on which the electronic circuit is disposed, the metal pattern being provided so as to be in an electrically floating state, in which the metal pattern is disposed at a place where it has a specified distance from the electronic circuit.

BRIEF DESCRIPTION OF DRAWINGS

The above and other aspects, features and advantages of the present disclosure will become more apparent from the following description of certain example embodiments when taken in conjunction with the accompanying drawings, in which.

EMBODIMENTS

First Example Embodiment

Figure 1:
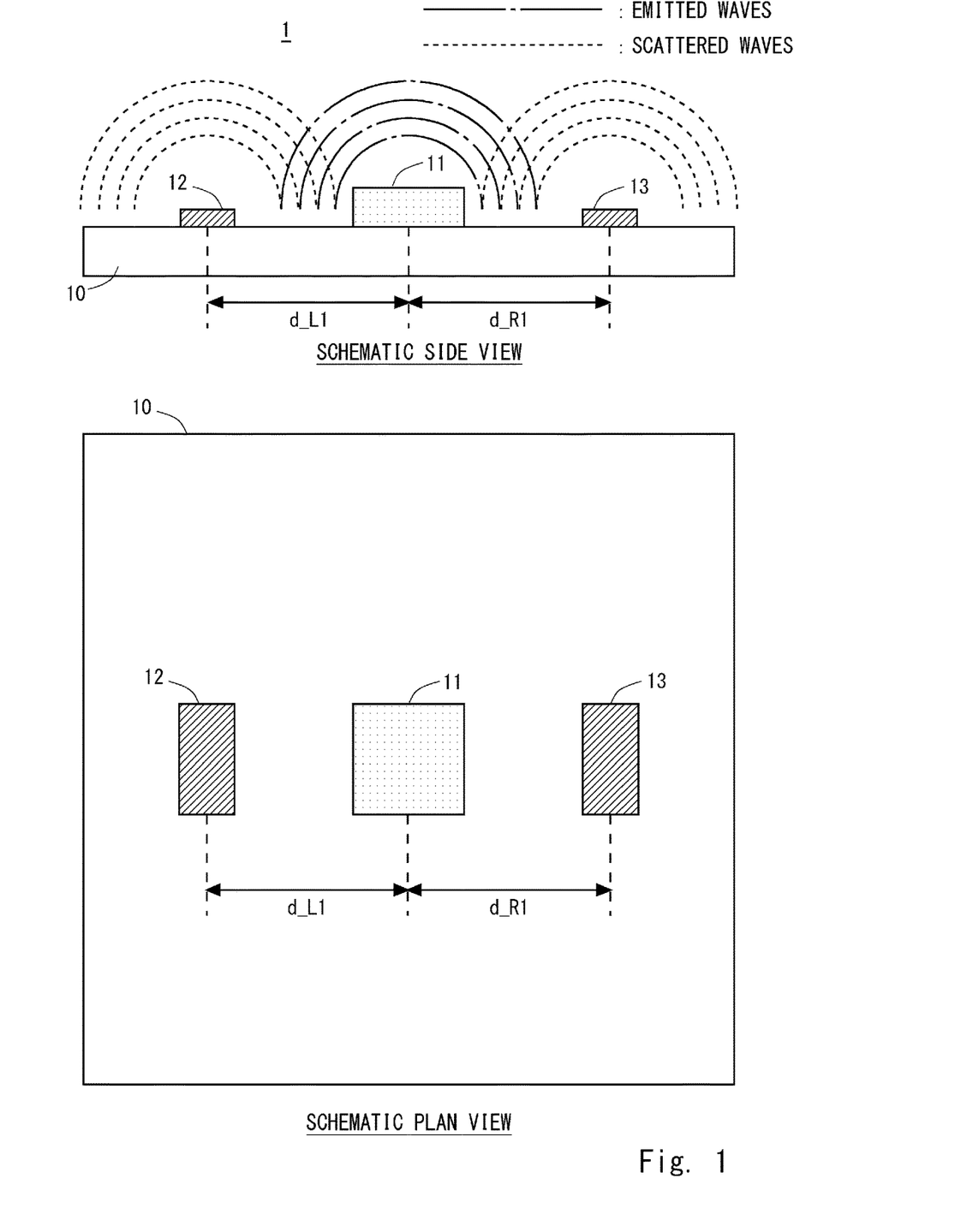
FIG. 1 is a schematic diagram of an electronic circuit apparatus according to a first example embodiment.

Example embodiments according to the present disclosure will be described hereinafter with reference to the drawings. FIG. 1 is a schematic diagram of an electronic circuit apparatus 1 according to a first example embodiment. In FIG. 1, an upper part shows a schematic diagram of the electronic circuit apparatus 1 as viewed from a side thereof, and a lower part shows a schematic diagram of the electronic circuit apparatus 1 as viewed from above it.

As shown in FIG. 1, the electronic circuit apparatus 1 according to the first example embodiment includes a substrate 10, an electronic circuit 11, a first metal pattern (e.g., a metal pattern 12), and a second metal pattern (e.g., a metal pattern 13). These metal patterns 12 and 13 (i.e., the metal strips 12 and 13) are formed so that they are in an electrically floating state. That is, the metal patterns 12 and 13 are provided on the substrate 10 so that they are not connected to the ground line. Note that an example in which the electronic circuit 11 is mounted on the substrate 10 will be described hereinafter. However, the concept of this term "electronic circuit 11" includes not only a semiconductor integrated circuit but also a single electric circuit component.

In the electronic circuit apparatus 1 according to the first example embodiment, the electronic circuit 11 is disposed on one predetermined surface of the substrate 10. The electronic circuit 11 is a digital circuit that operates based on a clock signal, or an analog circuit that, for example, amplifies an analog signal having a predetermined frequency. The electronic circuit 11 leaks or emits electromagnetic waves resulting from signals handled in the electronic circuit 11. Further, in the following description, the electromagnetic waves emitted from the electronic circuit 11 are also referred to as emitted waves. In the electronic circuit apparatus 1 according to the first example embodiment, the metal patterns 12 and 13 are formed. The metal patterns 12 and 13 are disposed on the same surface of the substrate 10 as the surface on which the electronic circuit 11 is disposed. In the example shown in FIG. 1, to the left of the electronic circuit 11 in the drawing, the metal pattern 12 is formed at a place where the distance from the electronic circuit 11 is a distance d_L1. Further, to the right of the electronic circuit 11 in the drawing, the metal pattern 13 is formed at a place where the distance from the electronic circuit 11 is a distance d_R1. These distances d_L1 and d_R1 are defined by Expressions (1) and (2), respectively, which will be described later. Further, the distances d_L1 and d_R1 indicate distances independent of each other. In the following description, when just one of the distances d_L1 and d_R1 is mentioned, it may be referred to as the distance d.

Figure 2:
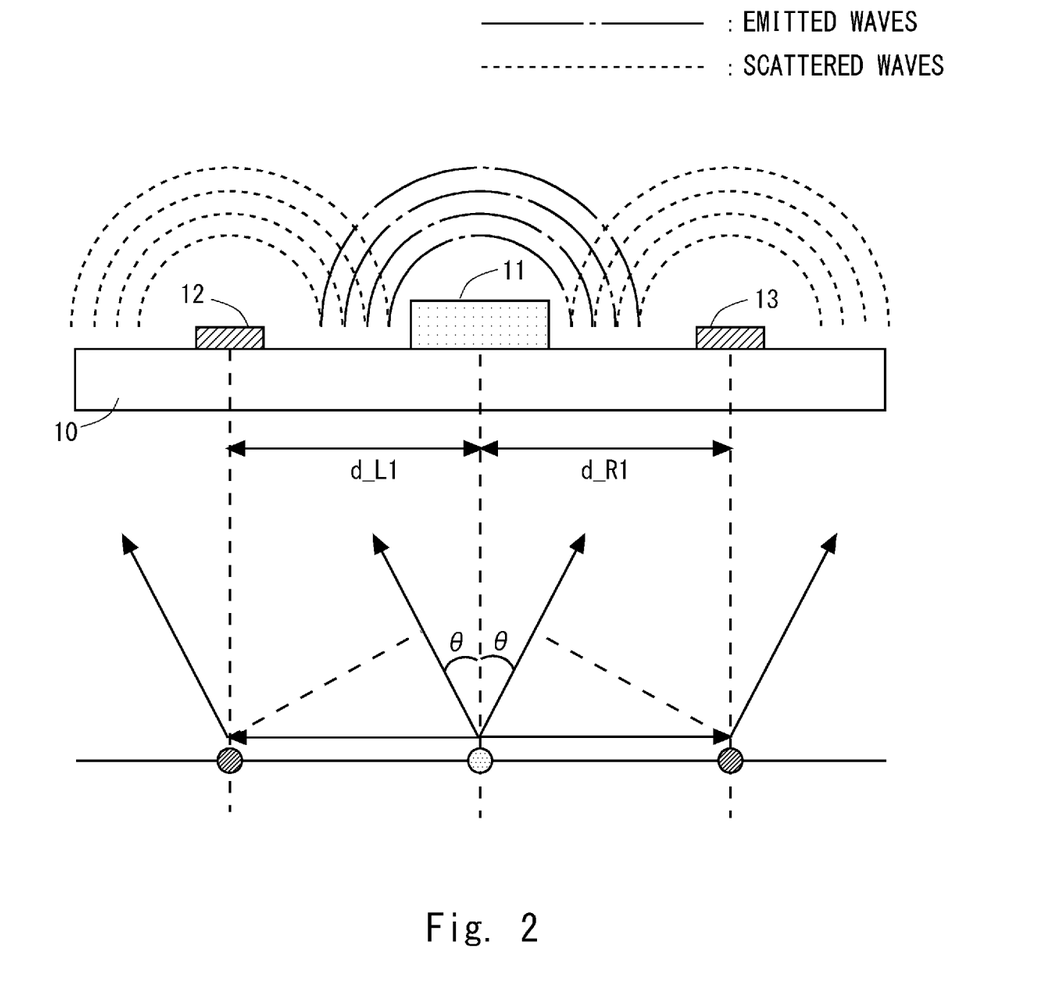
FIG. 2 is a diagram for explaining how to emit emitted waves in the electronic circuit apparatus according to the first example embodiment.

How emitted waves emitted from the electronic circuit 11 according to the first example embodiment propagate will be described hereinafter with reference to FIG. 2. In FIG. 2, the emitted waves are indicated by dashed lines, and the scattered waves emitted from the metal patterns 12 and 13 are indicated by dotted lines. As shown in FIG. 2, electromagnetic waves are emitted from the electronic circuit 11 (emitted waves). When parts of the emitted waves emitted from the electronic circuit 11 in the horizontal direction reaches the metal pattern 12 or 13, they are scattered and re-emitted from the metal pattern 12 or 13 in all the directions. Note that in the following description, the emitted waves that are re-emitted from the metal patterns are also referred to as scattered waves. The scattered waves re-emitted from the metal patterns 12 and 13 interfere with the emitted waves emitted from the electronic circuit 11, so that there are directions in which the emitted waves and the scattered waves are intensified by each other, and directions in which they are weakened by each other. Note that it is possible to adjust the intensifying directions or the weakening directions by adjusting the distance between the electronic circuit 11 and the metal patterns.

The distance d will be described hereinafter. The distance d can be categorized into two types of distances, i.e., a distance d1 with which the emitted waves and the scattered waves are intensified by each other, and a distance d2 with which the emitted waves and the scattered waves are weakened by each other. The distances d1 and d2 are expressed by the Expressions (1) and (2), respectively. In the expressions: n is an integer; λ is a wavelength of the emitted waves; and θ is an angle of a desired direction.

[Expression 1]
$$d1 = \frac{n\lambda}{1-\sin\theta} \quad (1)$$

[Expression 2]
$$d2 = \left(n + \frac{1}{2}\right)\lambda \cdot \frac{1}{1-\sin\theta} \quad (2)$$

By setting the distance d1 expressed by the Expression (1) or the distance d2 expressed by the Expression (2), it is possible to control the strength of the electric field in the desired direction.

Figure 3:
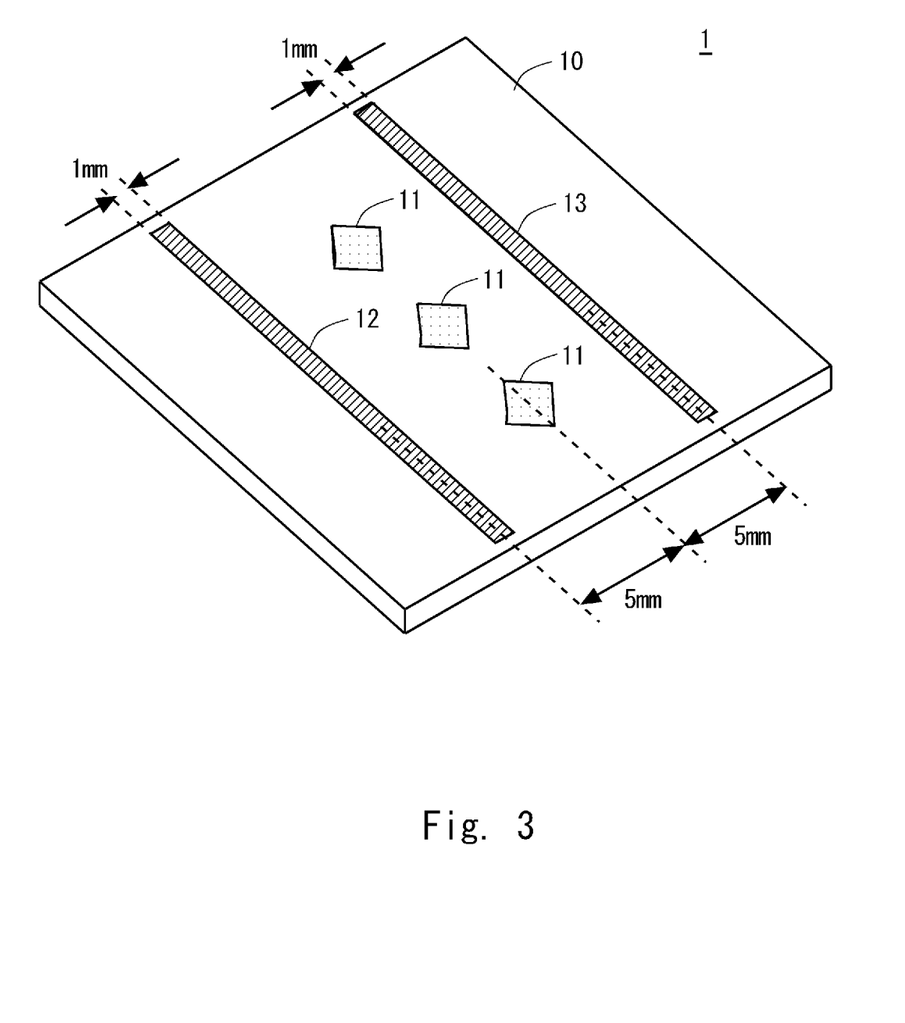
FIG. 3 shows an example of a configuration of the electronic circuit apparatus according to the first example embodiment.

Operation performed by the electronic circuit apparatus 1 according to the first example embodiment will be described in detail by using an example in which the distance d between the electronic circuit 11 and the metal patterns 12 and 13 (i.e., between the electronic circuit 11 and the metal pattern 12 and between the electronic circuit 11 and the metal pattern 13) is set to the distance d1. FIG. 3 shows an example of the electronic circuit apparatus 1 according to the first example embodiment. In the electronic circuit apparatus 1 shown in FIG. 3, three electronic circuits 10 are formed on the substrate 11. The set frequency of the electronic circuits 11 is 60 GHz. The metal patterns 12 and 13 are formed on both sides of the electronic circuits 11. Further, in the example shown in FIG. 3, the line width of the metal patterns 12 and 13 is 1 mm, and each of the distances d_L1 and d_R1 is 5 mm. The distances d_L1 and d_R1 are distances according to the Expression (1).

Figure 4:
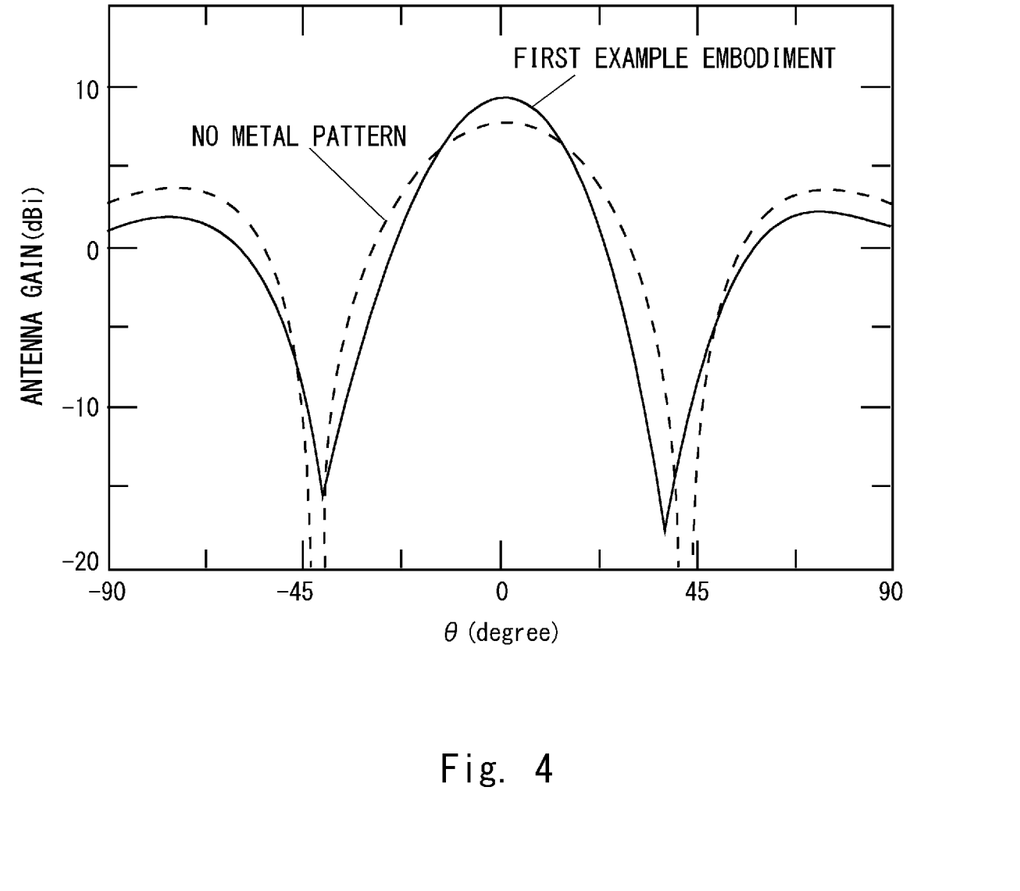
FIG. 4 is a graph of emission pattern characteristics for explaining an effect of suppressing electromagnetic waves in the electronic circuit apparatus shown in FIG. 3.

FIG. 4 shows emission-pattern characteristics showing the effect of the electronic circuit apparatus 1 shown in FIG. 3. FIG. 4 also shows, as a comparative example, emission-pattern characteristics of an electronic circuit apparatus that is obtained by removing the metal patterns 12 and 13 from the electronic circuit apparatus 1 shown in FIG. 3. As shown in FIG. 4, as compared to the electronic circuit apparatus according to the comparative example, the antenna gain in the horizontal direction(±90°) is reduced by about 3 dB and the antenna gain in the vertical direction is increased in the electronic circuit apparatus 1 according to the first example embodiment.

From these facts, in the electronic circuit apparatus 1 according to the first example embodiment, by disposing the metal patterns 12 and 13 on both sides of the electronic circuit 11 on the substrate 10 and setting the distance between the electronic circuit 11 and the metal patterns 12 and 13 (i.e., between the electronic circuit 11 and the metal pattern 12 and between the electronic circuit 11 and the metal pattern 13) based on the Expression (1), it is possible to control the strength of the electric field in the desired direction (the vertical direction in this analysis example) while suppressing the gain in the horizontal direction. Further, although no specific example is shown, by setting the distance between the electronic circuit 11 and the metal patterns 12 and 13 based on the Expression (2), it is possible to control the strength of the electric field in the desired direction while suppressing the gain in the horizontal direction. Note that although the metal patterns 12 and 13 are arranged on both sides of the electronic circuit 11 in the first example embodiment, it is also possible to suppress the gain only in one horizontal direction (e.g., only in the right direction or only in the left direction) by disposing a metal pattern only on one side of the electronic circuit 11. Further, although the metal patterns 12 and 13 are arranged on the left and right sides of the electronic circuit 11 in the above description, they may be arranged on the upper and lower sides of the electronic circuit 11, or on the upper, lower, left, and right sides thereof.

Further, in the electronic circuit apparatus 1 according to the first example embodiment, there is no need to connect the metal patterns 12 and 13 to the ground, and hence there is also no need to form a wiring mechanism (e.g., through holes) for connecting the metal patterns 12 and 13 to the underside of the substrate (or to a ground layer formed in the substrate). That is, the electronic circuit apparatus 1 according to the first example embodiment has a feature that: the configuration of the metal patterns 12 and 13 is simple; the strength of the electric field of the emitted waves in the horizontal direction can be suppressed; and at the same time, the strength of the electric field of the radio waves scattered in the desired direction can be controlled.

Second Example Embodiment

Figure 5:
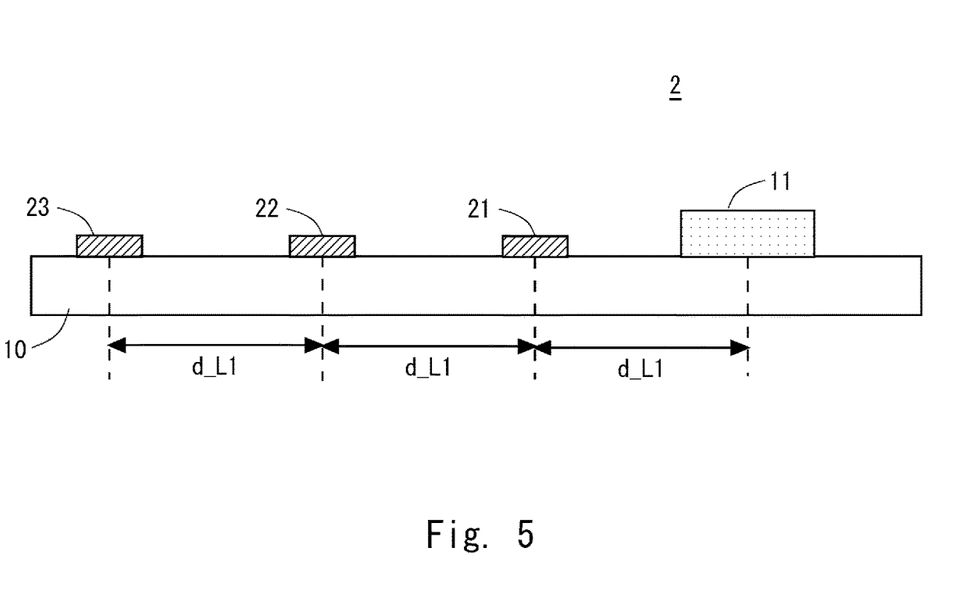
FIG. 5 is a schematic diagram of an electronic circuit apparatus according to a second example embodiment.

In a second example embodiment, an electronic circuit apparatus 2, which is a modified example of the electronic circuit apparatus 1 according to the first example embodiment, will be described. FIG. 5 is a schematic diagram of the electronic circuit apparatus 2 according to the second example embodiment. Although only metal patterns (i.e., metal strips) arranged on the left side of the electronic circuit 11 are shown in FIG. 5, metal patterns may also be arranged on the right side of the electronic circuit 11. Note that in the description of the second example embodiment, the same reference numerals and symbols as those in the first example embodiment are assigned to the same components and structures as those in the first example embodiment, and their descriptions will be omitted.

As shown in FIG. 5, the electronic circuit apparatus 2 according to the second example embodiment includes a plurality of metal patterns (i.e., a plurality of metal strips) arranged in the left direction in the drawing. Note that in the example shown in FIG. 5, three metal patterns (i.e., three metal strips), i.e., metal patterns 21 to 23, are shown. Further, the metal patterns 21 to 23 are arranged so that a distance between two neighboring pieces becomes the distance d_L1, which is determined by the Expression (1) or (2).

As described above, in the second example embodiment, a plurality of metal patterns are arranged in the same direction with respect to the electronic circuit 11. By adopting such a configuration, in the electronic circuit apparatus 2 according to the second example embodiment, it is possible to obtain effects that: the gain in the horizontal direction can be reduced even further as compared to that in the electronic circuit apparatus 1 according to the first example embodiment; and at the same time, the gain in the desired direction can be increased or reduced.

Third Example Embodiment

Figure 6:
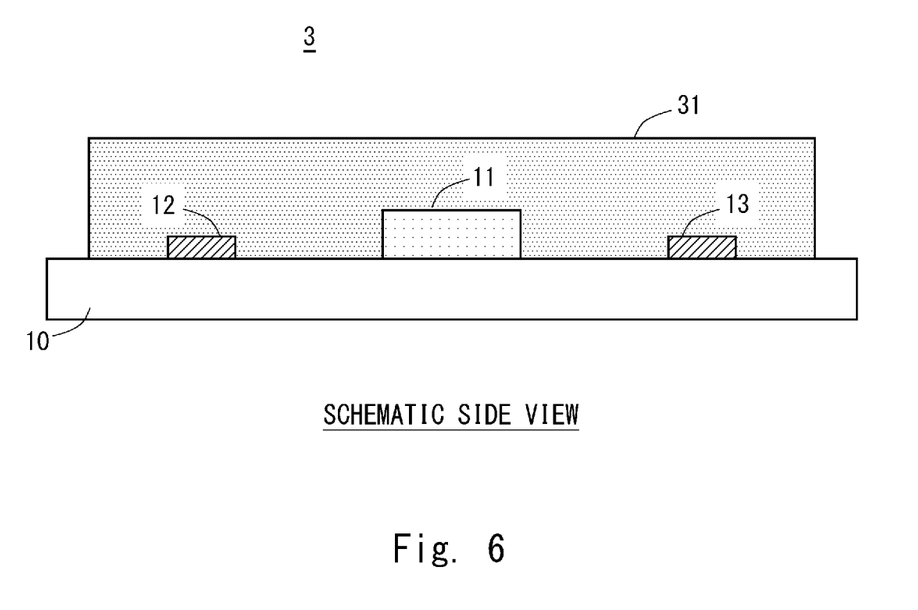
FIG. 6 is a schematic diagram of an electronic circuit apparatus according to a third example embodiment.
Figure 7:
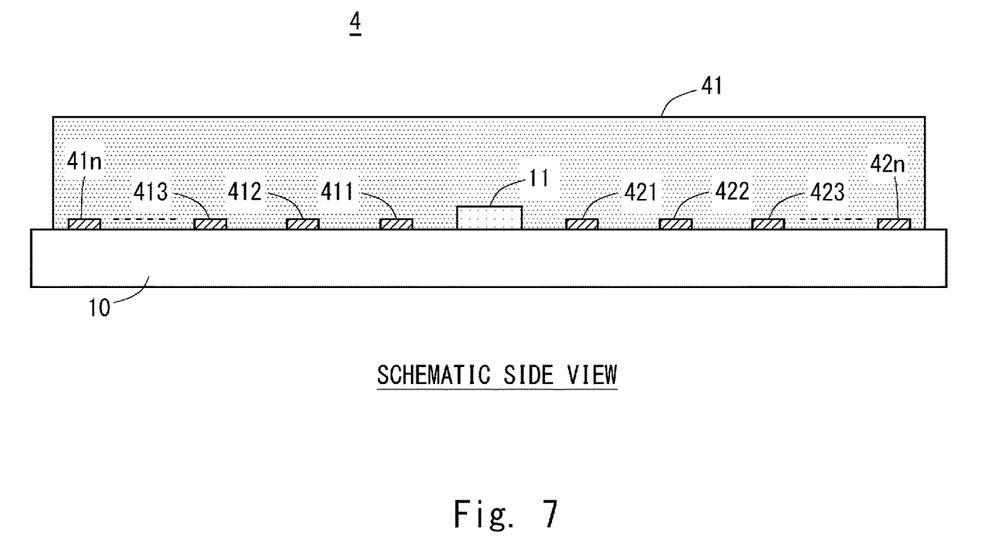
FIG. 7 is a schematic diagram for explaining another example of the electronic circuit apparatus according to the third example embodiment.

In a third example embodiment, electronic circuit apparatuses 3 and 4, which are modified examples of the electronic circuit apparatus 1 according to the first example embodiment, will be described. FIG. 6 is a schematic diagram of the electronic circuit apparatus 3 according to the third example embodiment, and FIG. 7 is a schematic diagram of the electronic circuit apparatus 4 according to the third example embodiment. Note that in the description of the third example embodiment, the same reference numerals and symbols as those in the first and second example embodiments are assigned to the same components and structures as those in the first and second example embodiments, and their descriptions will be omitted.

In the electronic circuit apparatus 3 according to the third example embodiment shown in FIG. 6, a resin film 31 is formed so as to cover the electronic circuit 11 and the metal patterns 12 and 13 on the surface which corresponds to the surface on which the electronic circuit 11 of the electronic circuit apparatus 1 are disposed in the first example embodiment.

Further, the electronic circuit apparatus 4 according to the third example embodiment shown in FIG. 7 is an electronic circuit apparatus in which a plurality of metal patterns (i.e., a plurality of metal strips) are arranged in the left and right directions (i.e., the left and right sides) of the electronic circuit 11. In the example shown in FIG. 7, n metal patterns 411 to 41*n* (i.e., n metal strips 411 to 41*n*) are arranged on the left side of the electronic circuit 11, and n metal patterns 421 to 42*n* (i.e., n metal strips 421 to 42*n*) are arranged on the right side of the electronic circuit 11. On the surface where the electronic circuit 11 is disposed, a resin film 41 is formed so as to cover the electronic circuit 11 and the metal patterns 411 to 41*n* and 421 to 42*n*.

When a resin film is formed, the wavelength 2 of emitted waves expressed by the Expressions (1) and (2) becomes an effective wavelength in which the dielectric constant of the resin film is taken into consideration. Further, when there is an antenna element together with the electronic circuit 11, it is possible, by covering the electronic circuit 11 and the metal patterns 12 and 13 with a resin film, to reduce the distance between the electronic circuit 11, which emits emitted waves, and the antenna element.

Fourth Example Embodiment

Figure 8:
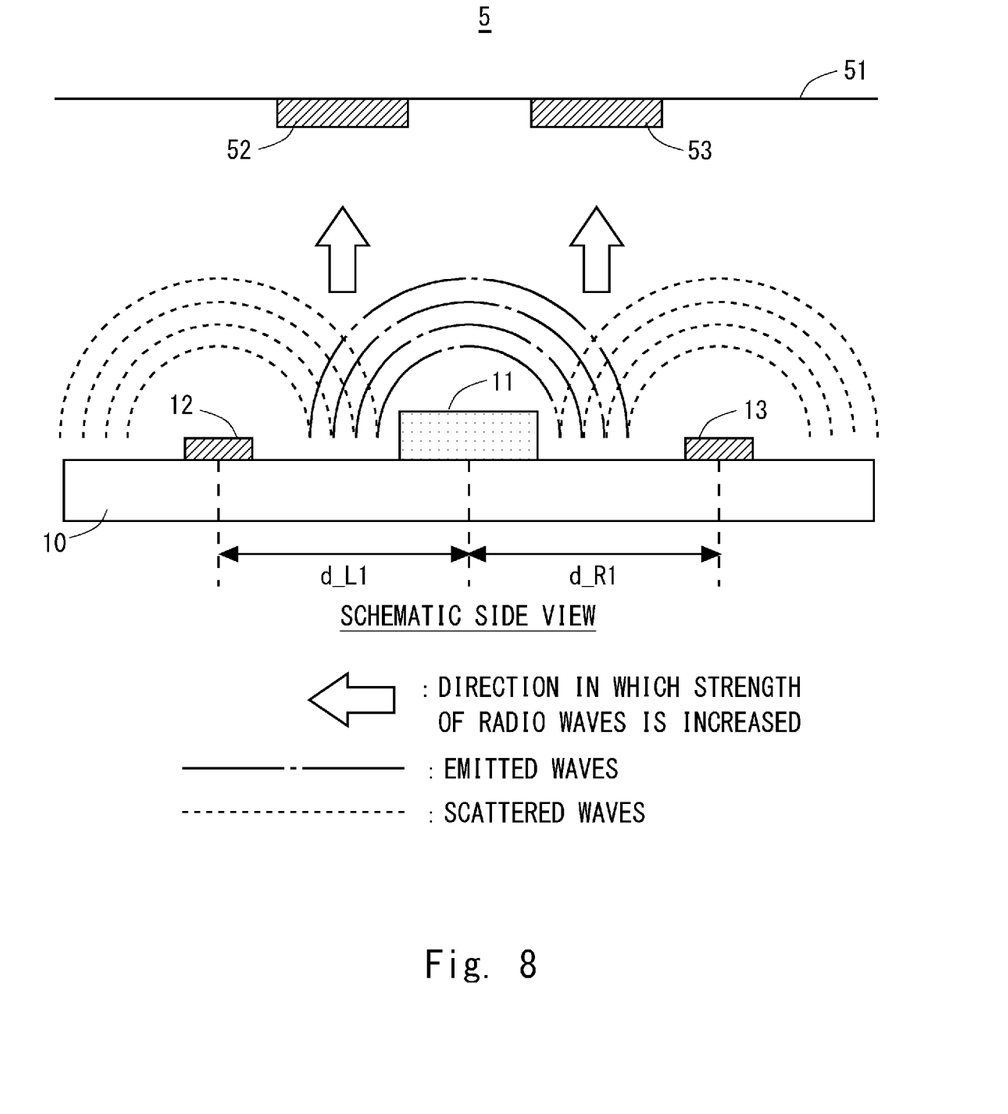
FIG. 8 is a schematic diagram of an electronic circuit apparatus according to a fourth example embodiment.

In a fourth example embodiment, an electronic circuit apparatus 5, which is a modified example of the electronic circuit apparatus 1 according to the first example embodiment, will be described. FIG. 8 is a schematic diagram of the electronic circuit apparatus 5 according to the fourth example embodiment. Note that in the description of the fourth example embodiment, the same reference numerals and symbols as those in the first example embodiment are assigned to the same components and structures as those in the first example embodiment, and their descriptions will be omitted.

As shown in FIG. 8, the electronic circuit apparatus 5 according to the fourth example embodiment is obtained by providing radio-wave absorbing elements 52 and 53 in a part of a housing cover 51 that covers the electronic circuit apparatus 1 according to the first example embodiment. The radio-wave absorbing elements 52 and 53 are disposed at places on the housing cover 51 (e.g., on the underside of the housing cover 51) which are located ahead of the direction in which the emitted waves emitted from the electronic circuit 11 and the scattered waves re-emitted from the metal patterns 12 and 13 are intensified by each other.

According to this example embodiment, it is possible to prevent the intensified radio waves from being reflected inside the housing and thereby affecting other components. Further, it is also possible to obtain the effect of weakening the strength of radio waves of the emitted waves and the scattered waves inside the housing by providing openings or gaps in the housing cover 51, instead of providing the radio-wave absorbing elements.

Fifth Example Embodiment

Figure 9:
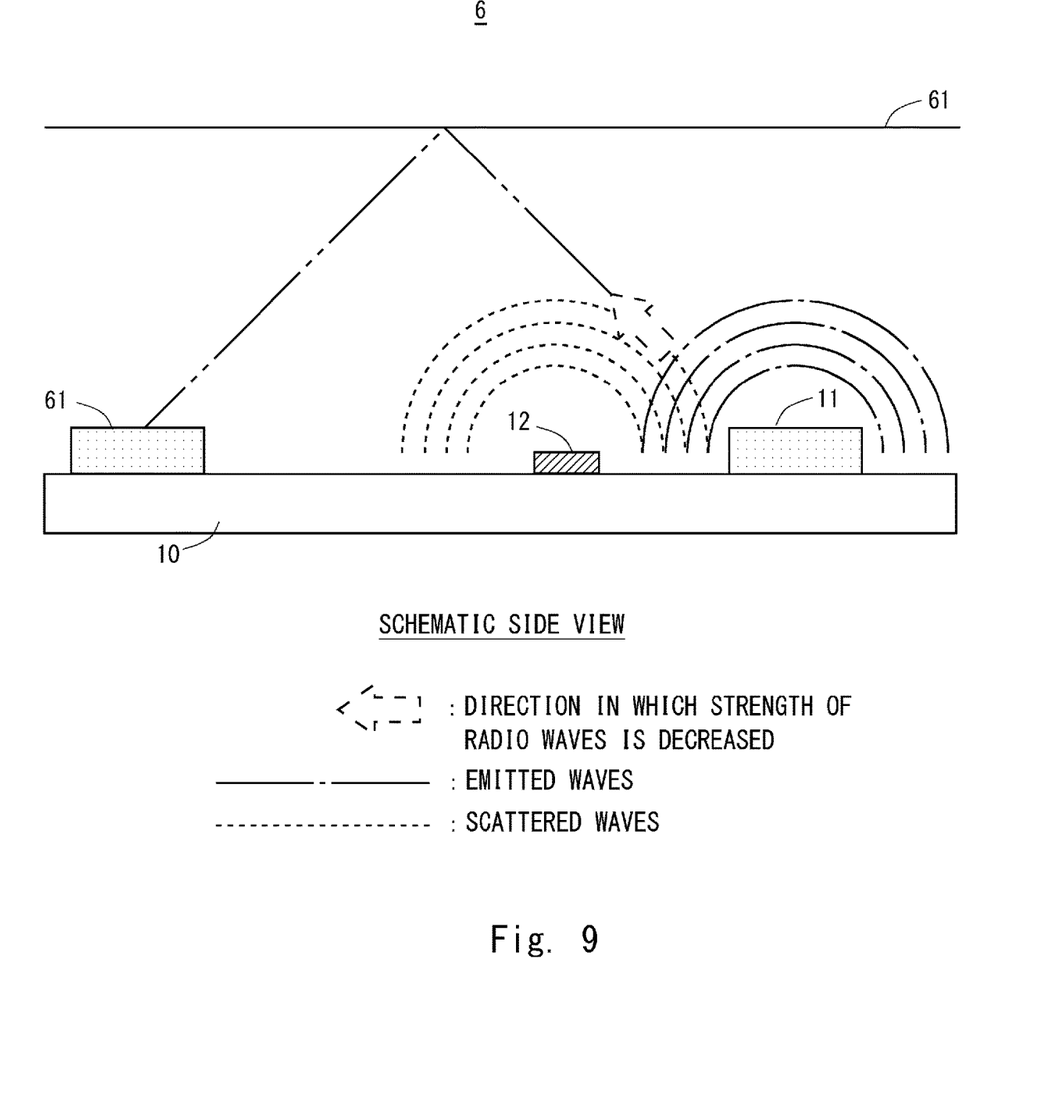
FIG. 9 is a schematic diagram of an electronic circuit apparatus according to a fifth example embodiment.

In a fifth example embodiment, an electronic circuit apparatus 6, which is a modified example of the electronic circuit apparatus 1 according to the first example embodiment, will be described. FIG. 9 is a schematic diagram of the electronic circuit apparatus 6 according to the fifth example embodiment. Note that in the description of the fifth example embodiment, the same reference numerals and symbols as those in the first example embodiment are assigned to the same components and structures as those in the first example embodiment, and their descriptions will be omitted.

As shown in FIG. 9, the electronic circuit apparatus 6 according to the fifth example embodiment is obtained by providing a housing cover 61 that covers the electronic circuit apparatus 1 according to the first example embodiment. Further, the electronic circuit apparatus 6 also includes another electronic circuit 62 that is disposed on the substrate 10 together with the electronic circuit 11. One of the features of this example embodiment lies in the place where the electronic circuit 62 is disposed. That is, the electronic circuit 62 is disposed in the direction in which the emitted waves emitted from the electronic circuit 11 and the scattered waves re-emitted from the metal pattern 12 are weakened by each other. As shown in FIG. 9, the electronic circuit 62 may be disposed at a place to which the weakened electromagnetic waves travel after being reflected by the housing cover 61.

In this way, the electronic circuit 62 can reduce the effect of the emitted waves emitted from the electronic circuit 11. Further, since this method for reducing the effect of the emitted waves is not a measure in which an additional component is added, it does not increases the number of components and hence does not make the apparatus complicated. Note that the housing cover 61 in this example embodiment is not an indispensable component. The main object of this example embodiment is to arrange the other electronic circuit 62 in the direction in which the electromagnetic waves are weakened by each other.

Sixth Example Embodiment

Figure 10:
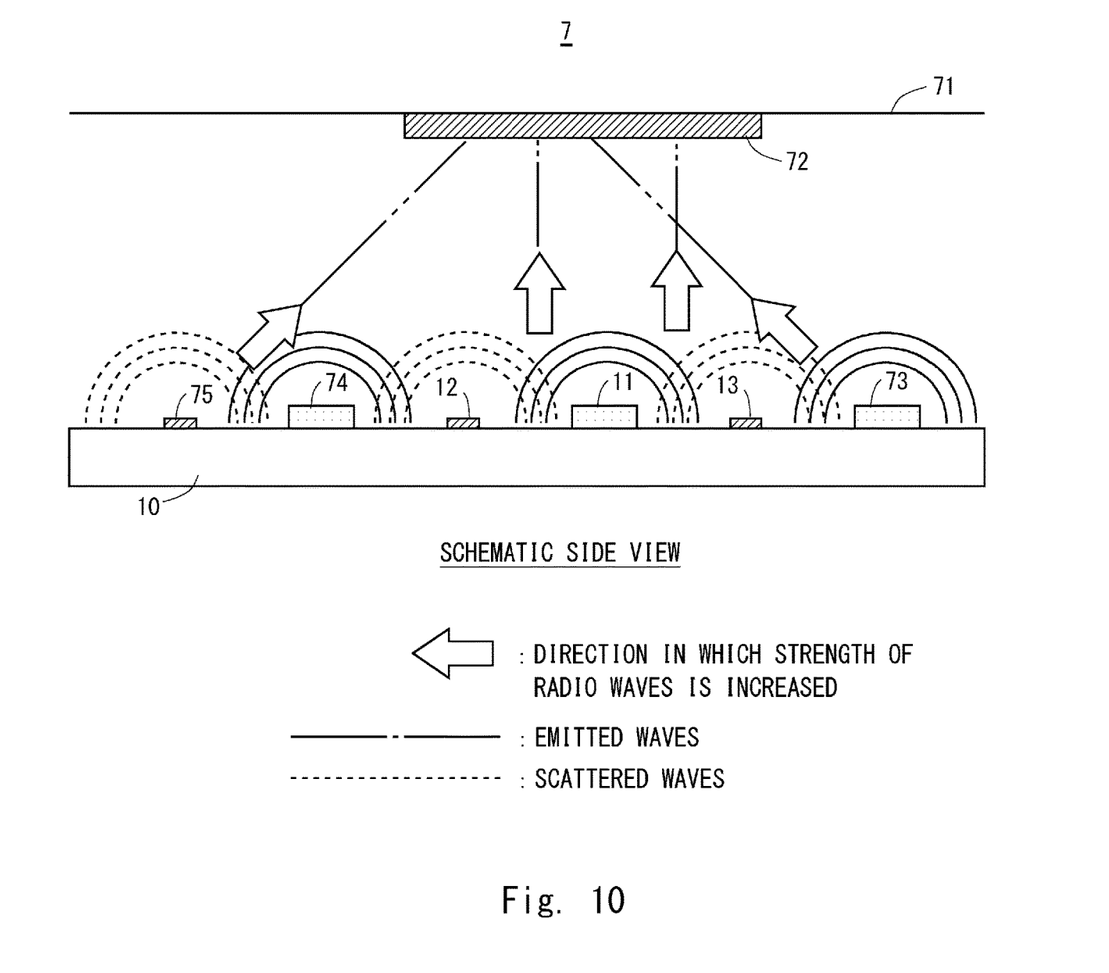
FIG. 10 is a schematic diagram of an electronic circuit apparatus according to a sixth example embodiment.

In a sixth example embodiment, an electronic circuit apparatus 7, which is a modified example of the electronic circuit apparatus 5 according to the fourth example embodiment, will be described. FIG. 10 is a schematic diagram of the electronic circuit apparatus 7 according to the sixth example embodiment. Note that in the description of the sixth example embodiment, the same reference numerals and symbols as those in the first and fourth example embodiments are assigned to the same components and structures as those in the first and fourth example embodiments, and their descriptions will be omitted.

As shown in FIG. 10, in the electronic circuit apparatus 7 according to the sixth example embodiment, electronic circuits 73 and 74 and a metal pattern 75 (i.e., a metal strips) are provided on the substrate 10 in addition to the electronic circuit 11 and the metal patterns 12 and 13. In this example embodiment, each of the electronic circuits 11, 73 and 74 generates emitted waves. Each distance between two neighboring ones among the metal patterns 12, 13 and 75 and these electronic circuits is adjusted so that the directions in which the emitted waves and the scattered waves are intensified by each other are concentrated within a predetermined range (i.e., a predetermined area) of a housing cover 71 that covers the substrate 10.

As can be understood from the above description, the electronic circuit apparatus 7 according to the sixth example embodiment can reduce the number of radio-wave absorbing elements even when there are a plurality of electronic circuits each of which generates signals. Further, according to this example embodiment, it is possible, by reducing the number of components, to prevent the configuration of the apparatus from becoming complicated.

Note that the present disclosure is not limited to the above-described example embodiments, and they may be modified as appropriate without departing from the spirit and scope of the present disclosure.

According to an electronic circuit apparatus in accordance with the present disclosure, it is possible to provide an electronic circuit apparatus capable of, with a small number of components, suppressing the effect of electromagnetic waves emitted from an electronic circuit.

The first to sixth embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. An electronic circuit apparatus comprising:
   a substrate;
   an electronic circuit disposed on the substrate; and
   a metal pattern formed on a same surface as a surface on which the electronic circuit is disposed, the metal pattern being provided so as to be in an electrically floating state, wherein
   the metal pattern is disposed at a place where the metal pattern has a specified distance from the electronic circuit, and
   the specified distance is a first distance or a second distance, the first distance being a distance at which emitted waves leaked or emitted from the electronic circuit and scattered waves emitted from the metal pattern are intensified by one another, and the second distance being a distance at which the emitted waves and the scattered waves are weakened by one another.

2. The electronic circuit apparatus according to claim 1, wherein the metal pattern is disposed to a left of or to a right of the electronic circuit, and/or is disposed above or below the electronic circuit.

3. The electronic circuit apparatus according to claim 1, wherein
   the metal pattern is one of a plurality of metal patterns that are arranged in a direction receding from the electronic circuit, and
   each of the plurality of metal patterns is disposed from the electronic circuit at the first distance or the second distance.

4. The electronic circuit apparatus according to claim 1, further comprising a resin film configured to cover the electronic circuit and the metal pattern.

5. The electronic circuit apparatus according to claim 1, further comprising a housing cover configured to cover the substrate, wherein
   the housing cover comprises a radio-wave absorbing element.

6. The electronic circuit apparatus according to claim 1, wherein a part of a different electronic circuit other than the electronic circuit that emits the emitted waves on the substrate is positioned at a place where the emitted waves emitted from the electronic circuit and the scattered waves reach after traveling in a direction in which the emitted waves and the scattered waves are weakened by one another, the scattered waves being parts of the emitted waves that have been re-emitted by the metal pattern.

7. The electronic circuit apparatus according to claim 1, further comprising a housing cover configured to cover the substrate, wherein
   a part of a different electronic circuit other than the electronic circuit that emits the emitted waves on the substrate is positioned at a place where the emitted waves emitted from the electronic circuit and the scattered waves reach after traveling in a direction in which the emitted waves and the scattered are weakened by one another and reflected by the housing cover, the scattered waves being parts of the emitted waves that have been re-emitted by the metal pattern.

* * * * *